United States Patent
Chen

(10) Patent No.: US 9,681,555 B2
(45) Date of Patent: Jun. 13, 2017

(54) PACKAGE OF ENVIRONMENTALLY SENSITIVE ELECTRONIC DEVICE AND FABRICATING METHOD THEREOF

(71) Applicant: INDUSTRIAL TECHNOLOGY RESEARCH INSTITUTE, Hsinchu (TW)

(72) Inventor: Kuang-Jung Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 375 days.

(21) Appl. No.: 14/192,401

(22) Filed: Feb. 27, 2014

(65) Prior Publication Data

US 2014/0268606 A1 Sep. 18, 2014

Related U.S. Application Data

(60) Provisional application No. 61/794,592, filed on Mar. 15, 2013.

(30) Foreign Application Priority Data

Sep. 13, 2013 (TW) .............................. 102133165 U

(51) Int. Cl.
*H05K 5/06* (2006.01)
*H05K 3/28* (2006.01)
*H05K 1/18* (2006.01)

(52) U.S. Cl.
CPC ............. *H05K 3/284* (2013.01); *H05K 1/189* (2013.01); *H05K 2201/10128* (2013.01); *H05K 2201/10136* (2013.01); *Y10T 29/49126* (2015.01)

(58) Field of Classification Search
CPC ............................... H05K 3/284; H05K 1/189
See application file for complete search history.

(56) References Cited

U.S. PATENT DOCUMENTS 5,288,989 A 2/1994 Ishaque et al.
5,730,919 A 3/1998 Wilfong et al.
(Continued)

FOREIGN PATENT DOCUMENTS

CN 1591527 A 3/2005
CN 101562233 A 10/2009
(Continued)

OTHER PUBLICATIONS

M. M. R. Howlader et al., A Novel Bonding Method for Ionic Wafers, IEEE Transactions on Advanced Packaging, 2007, p. 598-604, vol. 30, No. 4.
(Continued)

*Primary Examiner* — William H Mayo, III
*Assistant Examiner* — Hiram E Gonzalez
(74) *Attorney, Agent, or Firm* — Locke Lord LLP; Tim Tingkang Xia, Esq.

(57) ABSTRACT

A package of an environmentally sensitive electronic device and a fabricating method thereof are provided, wherein the package may include a first substrate, a second substrate, the environmentally sensitive electronic device, a packaging body, and a filler. In one or more embodiments, the environmentally sensitive electronic device may be disposed on the first substrate and located between the first substrate and the second substrate. The filler is disposed between the first substrate and the second substrate and covers the environmentally sensitive electronic device. The packaging body is sandwiched between the first substrate and the second substrate and encloses the environmentally sensitive electronic device and the filler. A material for the packaging (Continued)

body may include a bonding of transition metal and metalloid.

34 Claims, 19 Drawing Sheets

(56) References Cited

U.S. PATENT DOCUMENTS

| | | | |
|---|---|---|---|
| 5,874,804 A * | 2/1999 | Rogers | H05B 33/04 313/504 |
| 6,268,695 B1 | 7/2001 | Affinito | |
| 6,413,645 B1 | 7/2002 | Graff et al. | |
| 6,465,953 B1 | 10/2002 | Duggal | |
| 6,497,598 B2 | 12/2002 | Affinito | |
| 6,522,067 B1 | 2/2003 | Graff et al. | |
| 6,534,391 B1 * | 3/2003 | Huemoeller | H01L 23/49827 257/E23.067 |
| 6,570,325 B2 | 5/2003 | Graff et al. | |
| 6,573,652 B1 | 6/2003 | Graff et al. | |
| 6,576,351 B2 | 6/2003 | Silvernail | |
| 6,724,143 B2 * | 4/2004 | Chen | H01L 51/5237 313/506 |
| 6,743,524 B2 | 6/2004 | Schaepkens | |
| 6,866,901 B2 | 3/2005 | Burrows et al. | |
| 7,183,622 B2 | 2/2007 | Heck et al. | |
| 7,198,832 B2 | 4/2007 | Burrows et al. | |
| 7,378,301 B2 * | 5/2008 | Koh | B29C 45/14647 257/667 |
| 7,652,424 B2 | 1/2010 | Park et al. | |
| 7,671,959 B2 | 3/2010 | Koo et al. | |
| 7,901,991 B2 * | 3/2011 | Bonucci | H01L 31/048 257/682 |
| 8,093,512 B2 | 1/2012 | Chen et al. | |
| 8,264,143 B2 * | 9/2012 | Bae | H01L 51/5237 313/504 |
| 8,657,985 B2 * | 2/2014 | McCormick | H01L 51/0008 156/230 |
| 8,987,758 B2 | 3/2015 | Han et al. | |
| 2003/0168725 A1 | 9/2003 | Warner et al. | |
| 2005/0249901 A1 | 11/2005 | Yializis et al. | |
| 2006/0226523 A1 | 10/2006 | Foust et al. | |
| 2007/0172971 A1 | 7/2007 | Boroson | |
| 2008/0006819 A1 | 1/2008 | McCormick et al. | |
| 2009/0167132 A1 * | 7/2009 | Bae | H01L 51/0024 313/1 |
| 2010/0225875 A1 | 9/2010 | Wang et al. | |
| 2010/0258346 A1 | 10/2010 | Chen et al. | |
| 2011/0212304 A1 | 9/2011 | Han et al. | |
| 2012/0064278 A1 | 3/2012 | Chen | |
| 2012/0146240 A1 | 6/2012 | Dairiki et al. | |
| 2012/0241950 A1 | 9/2012 | Takahashi | |
| 2013/0020707 A1 | 1/2013 | Or-Bach et al. | |
| 2013/0095580 A1 | 4/2013 | Or-Bach et al. | |

FOREIGN PATENT DOCUMENTS

| | | |
|---|---|---|
| CN | 102898782 A | 1/2013 |
| JP | 2007098565 A | 4/2007 |
| JP | 2010225362 A | 10/2010 |
| TW | 570472 U | 1/2004 |
| TW | 200603416 | 1/2006 |
| TW | 200829070 A | 7/2008 |
| TW | 200917447 A | 4/2009 |
| TW | 201025690 A | 7/2010 |
| TW | 201037799 A | 10/2010 |
| TW | 201110203 A | 3/2011 |
| TW | 201143503 A | 12/2011 |
| TW | 201222683 A | 6/2012 |

OTHER PUBLICATIONS

Yu-Young Wang et al., Direct Encapsulation of Organic Light-Emitting Devices (OLEDs) Using Photo-Curable co-Polyacrylate/Silica Nanocomposite Resin, IEEE Transactions on Advanced Packaging, 2007, p. 421-427, vol. 30, No. 3.
R. M. Van Der Wel et al., B-Dry: Edge Sealant for Sensitive Photovoltaic Modules, IEEE, 2011, p. 001371-001374.
Yan Zhang et al., Effect of Encapsulation on OLED Characteristics with Anisotropic Conductive Adhesive, 2nd Electronics Systemintegration Technology Conference, 2008, p. 613-616.
Ryuichi Kondou et al., Nanoadhesion layer for enhanced Si—Si and Si—SiN wafer bonding, Microelectronics Reliability, 2012, p. 342-346, 52.
M. M. R. Howlader et al., Role of Heating on Plasma-Activated Silicon Wafers Bonding, Journal of the Electrochemical Society, 2009, p. H846-H851, vol. 156, Issue 11.
Richard Fu et al., Room Temperature Plasma Assisted Atomic Layer Deposition Al2O3 Film's Encapsulation Application in Organic Light Emitting Diodes, ISDRS, 2011, College Park, MD, USA.
Ryuichi Kondou et al., Room temperature SiO2 wafer bonding by adhesion layer method, Electronic Components and Technology Conference, 2011, p. 2165-2170.
Ryuichi Kondou et al., Room-temperature Si—Si and Si—SiN wafer bonding, School of Engineering, The University of Tokyo, Japan.
Ryuichi Kondou et al., Room-temperature Si—SiN wafer bonding by nano-adhesion layer method, Electronic Components and Technology Conference, 2010, p. 357-362.
Ryuichi Kondou et al., Si nanoadhesion layer for enhanced SiO 2SiN wafer bonding, ScienceDirect, Scripta Materialia, 2011, p. 320-322, 65.
M. M. R. Howlader et al., Surface activated bonding of 8 in. Si wafers for MEMS and microfluidic packaging, Electronic Components and Technology Conference, 2009, p. 1423-1429.
Renzheng Sang et al., Thin Film Encapsulation for OLED Display using Silicon Nitride and Silicon Oxide Composite Film, International Conference on Electronic Packaging Technology & High Density Packaging, 2011, p. 1175-1178.
C Y Li et al., Thin Film Encapsulation of OLED Displays with Organic-Inorganic Composite Film, Electronic Components and Technology Conference, 2008, p. 1819-1824.
Intellectual Property Office, Ministry of Economic Affairs, R.O.C., "Office Action", Taiwan, Jan. 9, 2015.
United States Patent and Trademark Office, "Office Action", Sep. 16, 2015, United States.
Intellectual Property Office, Ministry of Economic Affairs, R.O.C., "Office Action", Jul. 23, 2015, Taiwan.
Intellectual Property Office, Ministry of Economic Affairs, R. O. C, "Office Action", Apr. 18, 2016, Taiwan.
State Intellectual Property Office of the P. R. C, "Office Action", Apr. 21, 2016, China.
State Intellectual Property Office of the P. R. C, "Office Action", Sep. 6, 2016, China.
State Intelledual Properly Office of the P. R. C, "Office Action", Aug. 13, 2015, China.
State Intellectual Property Office of the P. R. C, "Office Action", Mar. 9, 2016, China.

* cited by examiner

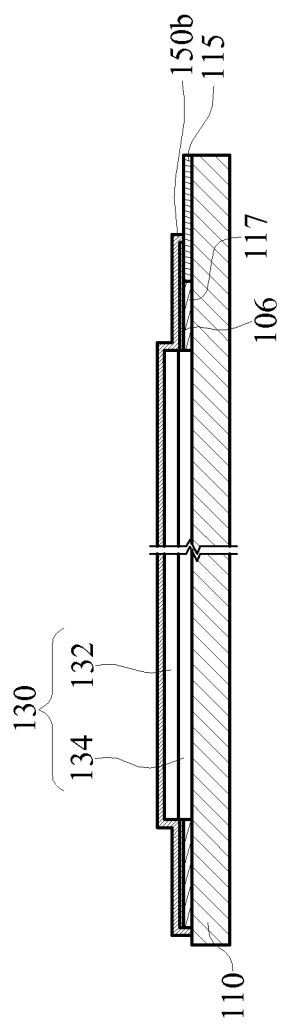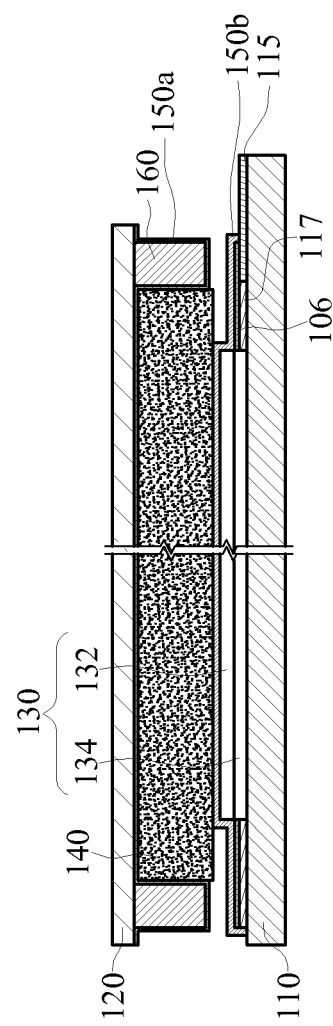

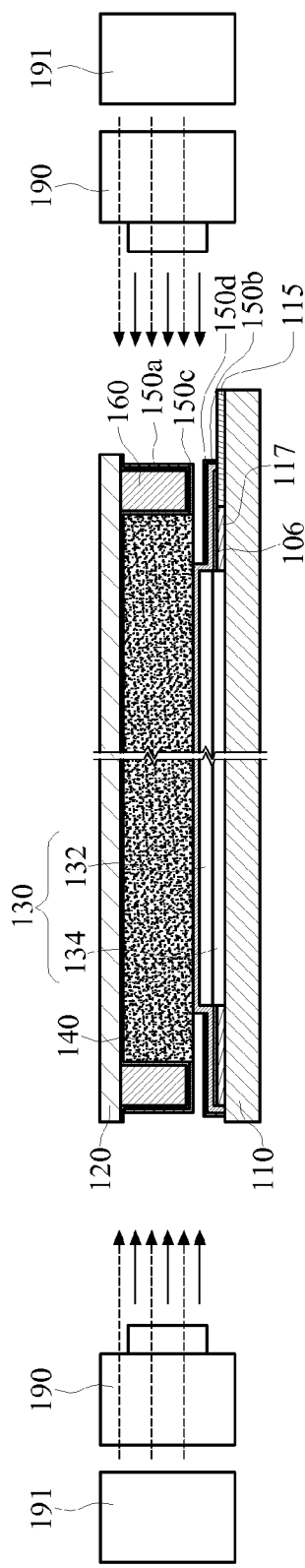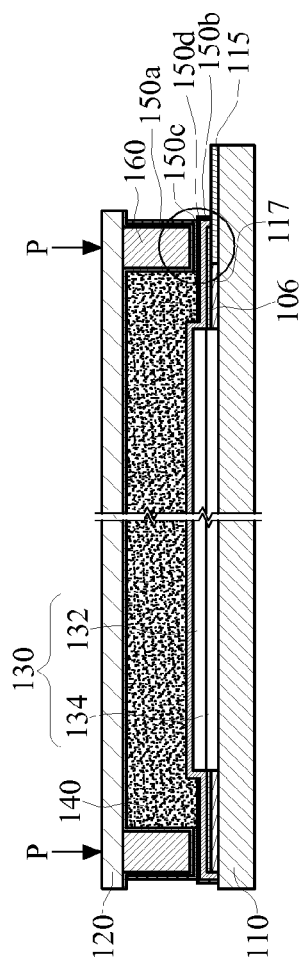
FIG.4L
FIG.4M

PACKAGE OF ENVIRONMENTALLY SENSITIVE ELECTRONIC DEVICE AND FABRICATING METHOD THEREOF

CROSS-REFERENCE TO RELATED APPLICATION

This application claims the priority benefits of U.S. provisional application Ser. No. 61/794,592, filed on Mar. 15, 2013 and Taiwan application serial no. 102133165, filed on Sep. 13, 2013. The entirety of each of the above-mentioned patent applications is hereby incorporated by reference herein and made a part of this specification.

TECHNICAL FIELD

The present disclosure generally relates to a package of an environmentally sensitive electronic device and a fabricating method thereof.

BACKGROUND

Recent years, flexible devices are widely used. A main component of the flexible devices is a flexible substrate. Flexible substrates have a wide range of applications because of flexibility, ease of carriage, safety, and applications in consumer products. Preventing the flexible substrates from the transmission of water vapor and oxygen, and accelerated aging becomes important to meet commercial needs.

SUMMARY

According to one or more exemplary embodiments, a package of an environmentally sensitive electronic device and a method of manufacturing the same are provided, the package of an environmentally sensitive electronic device may comprise: a first substrate, a second substrate, an environmentally sensitive electronic device, and a packaging body (or called as sealing area). At least a portion of the peripheral edge of the first substrate is defined as the first encapsulation area, and the first encapsulation area has a first packaging material. The environmentally sensitive electronic device may be located on the first substrate, and is surrounded by the first encapsulation area. At least a portion of the peripheral edge of the second substrate is defined as the second encapsulation area, the location of the second encapsulation area corresponds to the location of the first encapsulation area, and the second encapsulation area has a second packaging material. The packaging body is in between the first encapsulation area and the second encapsulation area. The packaging body comprises a bonding layer formed by at least part of the first packaging material and part of the second packaging material.

The present disclosure provides a method of packaging an environmentally sensitive electronic device. In the exemplary embodiments, an environmentally sensitive electronic device may be formed on a first surface of a first substrate, first metalloid layer is placed on the first surface of the first substrate, a second metalloid layer is placed on a second surface of the second substrate, the second substrate is covered on the first substrate, so that the first and second surfaces may face to each other. Surface activation may be performed on the first metalloid layer and the second metalloid layer in a vacuum environment. The first substrate and the second substrate which are applied with pressure and the first surface in the first encapsulation area and the second surface in the second encapsulation area contact each other, so that a packaging body with a bonding of metalloid and transition-metal is formed between the activated first metalloid layer and the activated second metalloid layer.

BRIEF DESCRIPTION OF DRAWINGS

The present disclosure will become more fully understood from the detailed description given herein below for illustration only, and thus are not limitative of the present disclosure, and wherein.

DETAILED DESCRIPTION OF DISCLOSED EMBODIMENTS

Reference will now be made in detail to exemplary embodiments which are illustrated in the accompanying drawings. Hereinafter, the embodiments are described with figures. It should be appreciated that the embodiments described herein are used for describing and explaining the present disclosure but not for limiting the disclosure.

Figure 1A:
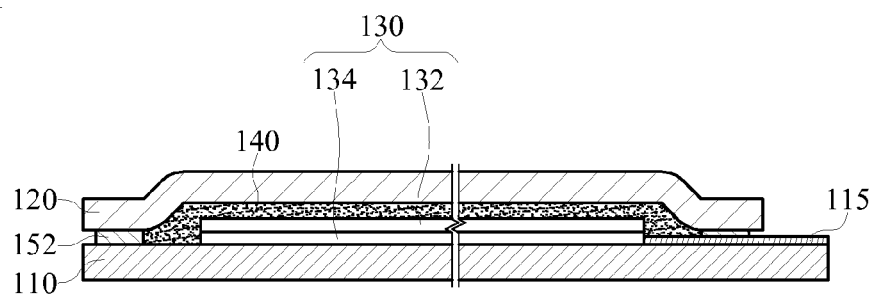
FIG. 1A illustrates a schematic cross-sectional view of a package in accordance with a first embodiment in this disclosure.
Figure 1B:
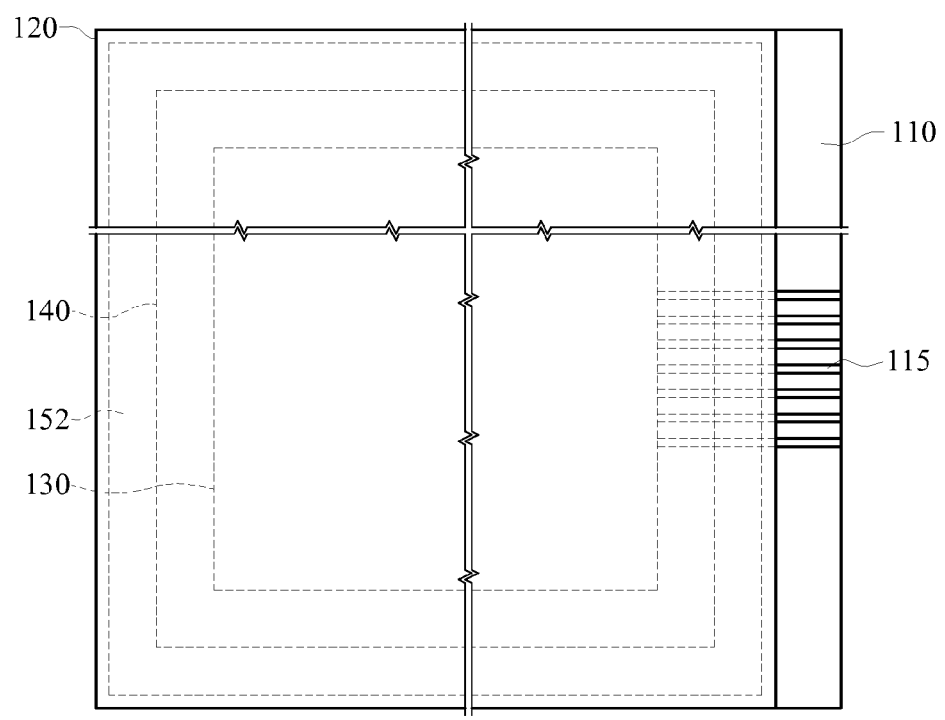
FIG. 1B illustrates a top view of a package in accordance with the first embodiment in this disclosure.

Referring to FIG. 1A and FIG. 1B, FIG. 1A illustrates a cross-sectional view of a package in accordance with the first embodiment in this disclosure and FIG. 1B illustrates a top view of the package in accordance with the first embodiment. In the first embodiment, a package 10a comprises a first substrate 110, a plurality of trace wires 115, a second substrate 120, an environmentally sensitive electronic device 130, a filler 140, and a packaging body 152 (or called as sealing area). Wherein the filler 140 may be one kind of plastic packaging material, and for easy illustration, the plastic packaging material is taken as an example of the following filler 140, but not intended to limit the scope of the present disclosure. The filler 140 is disposed between the first substrate 110 and the second substrate 120, and the filler 140 covers the environmentally sensitive electronic device 130.

For the first substrate 110, at least a portion of the peripheral edge of the first substrate 110 is defined as the first encapsulation area, and the first encapsulation area has a first packaging material for forming the packaging body 152. The first substrate 110 may be a flexible substrate or a rigid substrate, which does not limit the present disclosure. Wherein the flexible substrate may be made of polyethylene terephthalate (PET), polyethylene naphthalate (PEN), polyethersulfone (PES), polymethyl methacrylate (PMMA), polycarbonate (PC), polyimide (PI) or a metal foil. The rigid substrate may be made of glass, a printed circuit board (PCB), a metal substrate, or any other equivalent packaging material.

In one of exemplary embodiments, the second substrate 120 is disposed on the first substrate and the second substrate 120 in at least part of the peripheral edge of the package (i.e. the peripheral edge of the second substrate 120) is defined as a second encapsulation area. The location of the second encapsulation area corresponds to the location of the first encapsulation area, and the second encapsulation area has a second packaging material for forming the packaging body 152. The second substrate 120 is, for example but not limited to, a flexible substrate or a rigid substrate. The flexible substrate is made of, for example but not limited to, PET, PEN, PES, PMMA, PC, PI, or metalloid foil. The rigid substrate may be made of glass, a PCB, a metal substrate, or any other equivalent packaging material. In an embodiment of this disclosure, both of the first substrate 110 and the second substrate 120 are flexible substrates.

The first substrate 110 and the second substrate 120 can be a functional substrate, and the functional substrate is, for example but not limited to, a gas barrier substrate, a color filter substrate, an UV barrier function substrate, an anti-scratch resistant substrate, an improving light removing functional substrate, a touch function substrate, wherein the touch function substrate is, for example but not limited to, a surface capacitive touch substrate, a digital matrix touch substrate (such as a projected capacitive touch substrate), an analog matrix touch substrate, or a substrate integrating two or more of the above mentioned functions, such as an integration substrate with the gas barrier and touch functions, and other combinations will not elaborate in details.

The environmentally sensitive electronic device 130 is disposed on the first substrate 110, sandwiched between the first substrate 110 and the second substrate 120, and surrounded by the first encapsulation area and the second encapsulation area. In one of exemplary embodiments, the environmentally sensitive electronic device 130 comprises a display medium 132 and an active device 134 (or a passive device). In the first embodiment of this disclosure, the environmentally sensitive electronic device 130 is, for instance, an active environmentally sensitive display device or a passive environmentally sensitive display device. The active environmentally sensitive display device is, for example but not limited to, an active matrix organic light emitting diode (AMOLED), an active matrix electrophoretic display (AMEPD), an active matrix liquid crystal display (AMLCD), an active matrix blue phase liquid crystal display (AMBPLCD), or any other equivalent. The passive environmentally sensitive display device is, for example but not limited to, a passive matrix OLED (PMOLED), a super twisted nematic liquid crystal display (STNLCD), or any other equivalent. Other environmentally sensitive display device is, for example but not limited to, an organic solar cell, an organic photo sensor, etc. and will not elaborate in details.

The plurality of trace wires 115 may be disposed on the first substrate 110 and connected to the environmentally sensitive electronic device 130. The trace wire 115 can be a signal transmission media via which the environmentally sensitive electronic device 130 can interact with external circuits. The trace wire 115 is made of, for example but not limited to, metal or metal alloy.

The filler 140 may be disposed between the first substrate 110 and the second substrate 120, and the filler 140 covers the environmentally sensitive electronic device 130. In the first exemplary embodiment, the filler 140 is, for instance but not limited to, acrylic resin or expoxy resin, the filler 140 may be a film-type adhesive packaging material, or be a liquid adhesive before being solidified. In some embodiments (described later), the environmentally sensitive electronic device may not have the filler 140 disposed thereto.

The packaging body 152 may be disposed between the first substrate 110 and the second substrate 120, and the packaging body 152 may include a portion of the first packaging material and a portion of the second packaging material. In the first exemplary embodiment, the packaging body 152, as shown in FIG. 1B, encloses the environmentally sensitive electronic device 130 and the filler 140. So-called "surround," "cover" or "enclose" of this disclosure means that one component in the package 10a is disposed on one region of the first substrate 110 nearby one side of the environmentally sensitive electronic device 130, disposed on two regions of the first substrate 110 nearby any two sides of the environmentally sensitive electronic device 130, disposed on three regions of the first substrate 110 nearby any three sides of the environmentally sensitive electronic device 130, or disposed on regions of the first substrate 110 nearby all sides of the environmentally sensitive electronic device 130, and the disclosure will not be limited thereto. To enclosed surround or to completely surround the environmentally sensitive electronic device 130 means to surround all sides of the environmentally sensitive electronic device 130. To non-enclosed surround or to partially surround the environmentally sensitive electronic device 130 means to surround less than all sides of the environmentally sensitive electronic device 130. The packaging material (i.e. the first packaging material and the packaging material) for the packaging body 152 includes, for example but not limited to, metalloid and transition-metal. The bonding of metalloid and transition-metal is, for example but not limited to, Fe—Si bonding, Cr—Si bonding, Nb—Si bonding, Al—Si bonding, Al—As bonding, Ga—As bonding or Pb—Si bonding.

The first substrate 110 may be disposed with a metalloid layer on its first encapsulation area, and the second substrate 120 may also be disposed with a metalloid layer on its second encapsulation area. The two metalloid layers are, for example but not limited to, silicon (Si)-containing films, which may be, for example but are not limited to, $SiN_x$, $SiO_x$, $SiO_xN_y$, $SiN_xO_y$, where x and y can be any real number. The method for forming the metalloid layer is, for example but not limited to, a chemical vapor deposition (CVD) method, an atomic layer deposition (ALD) method or a sputtering deposition method. The surfaces of two metalloid layers are respectively doped with the first packaging material and the second packaging material to perform surface activation on the two metalloid layers, and the known doping process method is, for example but not limited to, referred to "Room temperature SiO2 wafer bonding by adhesion layer method; R Kondou, T Suga, Technology Conference (ECTC), 2011" to first do etching by the ion beam and then do doping by ion-beam sputtering deposition.

The first packaging material and the second packaging material can contact with each other under a certain pressure to form bonding of metalloid and transition-metal, and the junction of the first metalloid layer and the first packaging material and the junction of the second metalloid layer and the second packaging material respectively have bonding of metalloid and transition-metal, for example but not limited to, Si—Fe bonding. The packaging body 152 may include a bonding layer formed by at least a portion of the first packaging material and at least a portion of the second packaging material (not shown in the drawings).

The transition-metal in the bonding of metalloid and transition-metal is, for example but not limited to, Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, or Hg. One of the exemplary embodiments takes Fe or Cr as an example. The first metalloid layer is, for example but not limited to, boron, borides, silicon, silicide, germanium, germanium compounds, arsenic, arsenic, antimony, antimony compounds, tellurium, tellurides, polonium or polonium compounds, and one of the exemplary embodiments takes Si as an example.

In brief, because the packaging body 152 is disposed between the first substrate 110 and the second substrate 120, and encloses the environmentally sensitive electronic device 130 and the filler 140, the packaging body 152 prevents the environmentally sensitive electronic device 130 from water vapor and oxygen. Hence, the lifespan of the environmentally sensitive electronic device 130 may be prolonged.

Figure 2A:
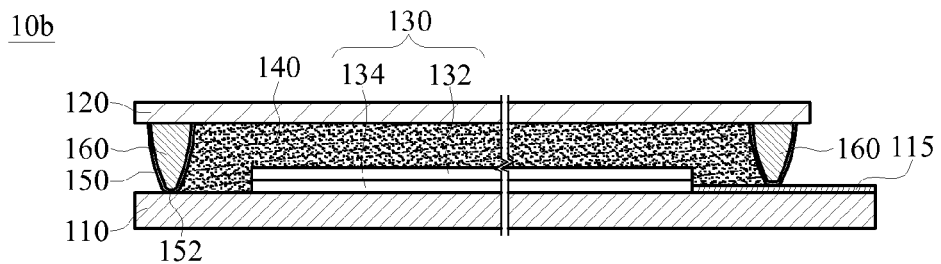
FIG. 2A illustrates a schematic cross-sectional view of a package in accordance with a second embodiment in this disclosure.

In a second embodiment, referring to FIG. 2A, FIG. 2A illustrates a cross-sectional schematic of a package in accordance with the second embodiment of this disclosure. The package 10b may comprise a first substrate 110, a plurality of trace wires 115, a second substrate 120, an environmentally sensitive electronic device 130, a filler 140, a metalloid layer 150, a packaging body 152, and a first sidewall barrier (SWB) 160. The first sidewall barrier 160 has, for example but not limited to, a strip shape. The first sidewall barrier 160 is disposed on the second substrate 120. The metalloid layer 150 is disposed between the first substrate 110 and the first sidewall barrier 160. The packaging body 152 is sandwiched between the metalloid layer 150 and the first substrate 110. The packaging body 152 is formed by the top portion of the first sidewall barrier 160 in the metalloid layer 150. In other words, a top surface of the first sidewall barrier 160 is planar, and the packaging body 152 is between the top surface and the first substrate 110.

The aforementioned first sidewall barrier 160 is in the second encapsulation area on the second substrate 120. The material of the first sidewall barrier 160 may be, for example but not limited to, PI, acrylic, resin, epoxy resin, PET, PEN, PES, PMMA, PC, metal or glass. The metalloid layer 150 can be a film covering the first sidewall barrier 160, the surface of the metalloid layer 150 may be doped with a second packaging material, and the metalloid layer 150 may be, for example but are not limited to, silicon (Si), silicon nitride (SiNx), silicon oxide (SiOx), silicon oxynitride (SiNxOy) or any other similar packaging material, may be formed by a monolayer or multiple layers through the chemical gas phase deposition (CVD), atomic deposition (ALD) method or sputtering deposition production. The metalloid layer 150 can be a film covering the first encapsulation area of the first substrate 110, and deposited and doped with a first packaging material, and the first encapsulation area and the second encapsulation area face to each other. The packaging body 152 is formed in the contact region of the first packaging material and the second packaging material. Therefore, the packaging body 152 (seen the schematic enlarged section in FIG. 4N) can be located in between the first substrate 110 and the first sidewall barrier 160.

Figure 2B:
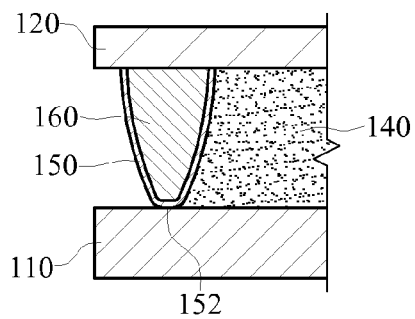
FIG. 2B illustrates a partial cross-sectional view of the first barrier in the second embodiment in this disclosure.

Referring to FIG. 2B, FIG. 2B illustrates a partial cross-sectional view of the package in FIG. 2A. The first sidewall barrier 160 can be bell-shaped in present embodiment. The metalloid layer 150 can be disposed on the first sidewall barrier 160 with a conformal coating technique. It is noted that a contact region between the metalloid layer 150 and the first substrate 110 is the packaging body 152.

Figure 2C:
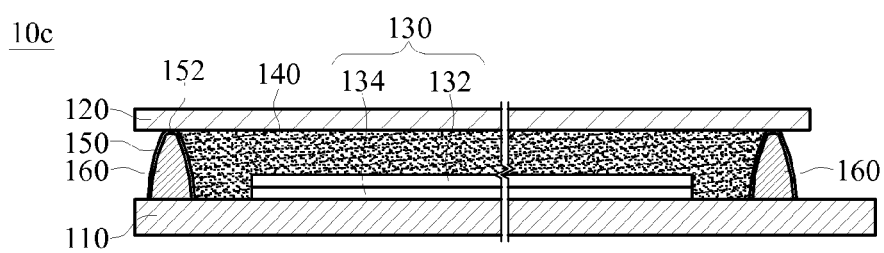
FIG. 2C illustrates a schematic cross-sectional view of a third embodiment in this disclosure.

In a third embodiment, referring to FIG. 2C, FIG. 2C illustrates a cross-sectional view of a package in accordance with the third embodiment of this disclosure. In the package 10c, the first sidewall barrier 160 can be disposed on the first encapsulation area of the first substrate 110. The metalloid layer 150 can be a film covering the first sidewall barrier 160, and the surface of the metalloid layer 150 may be disposed and doped with a first packaging material. Another metalloid layer 150 doped with the second packaging material is disposed in the second encapsulation area of the second substrate 120. As similar as the packaging body 152 in FIG. 2A, the packaging body 152 in FIG. 2C is formed in the contact region between the metalloid layer 150 and the second substrate 120 in the second encapsulation area.

Figure 2D:
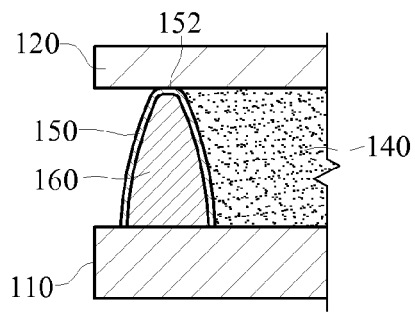
FIG. 2D illustrates a partial cross-sectional view of the first barrier in the third embodiment in this disclosure.

Referring to FIG. 2D, FIG. 2D illustrates a partial cross-sectional view of the package in FIG. 2C. As an example and not by way of limitation, the shape of the first sidewall barrier 160 can be bell-shaped as in present embodiment. The metalloid layer 150 is disposed on the first sidewall barrier 160 with a conformal coating technique. It is noted that the packaging body 152 may be formed in a contact region between the metalloid layer 150 and the second substrate 120.

Figure 2E:
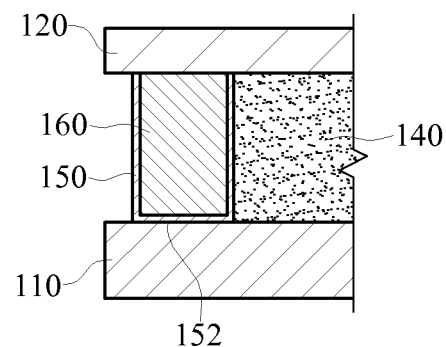
FIG. 2E to FIG. 2N illustrate partial cross-sectional views of various embodiments of a package in accordance with this disclosure.
Figure 2F:
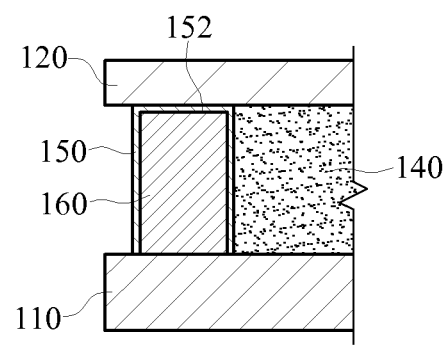
Figure 2G:
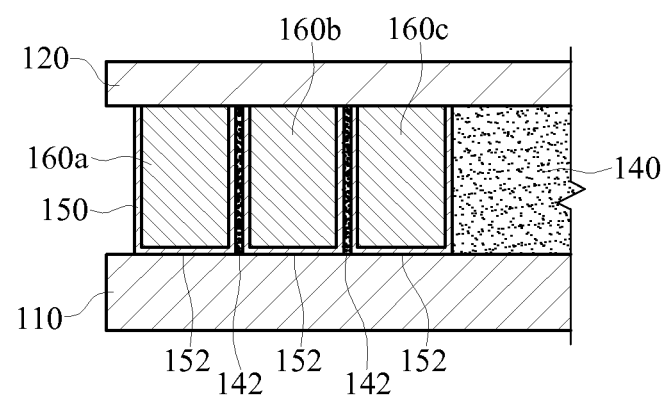
Figure 2H:
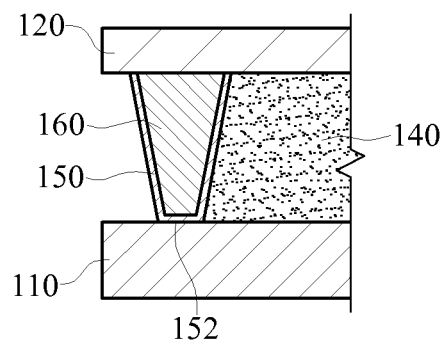
Figure 2I:
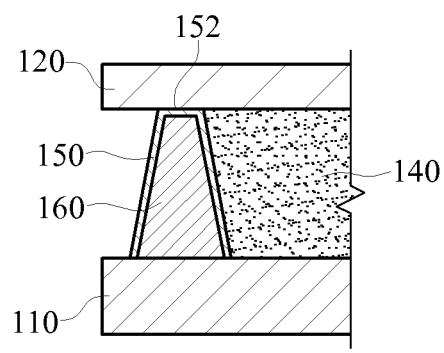
Figure 2J:
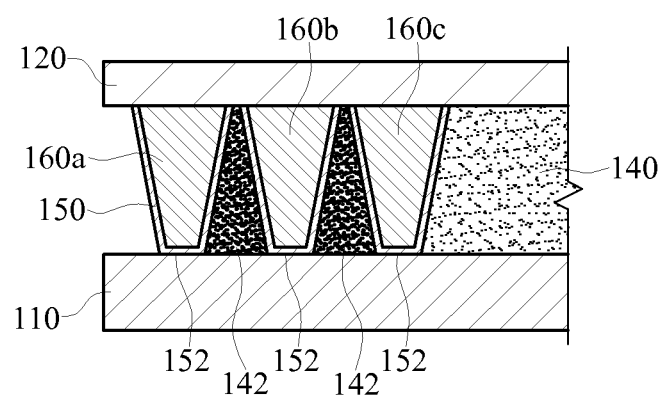
Figure 2K:
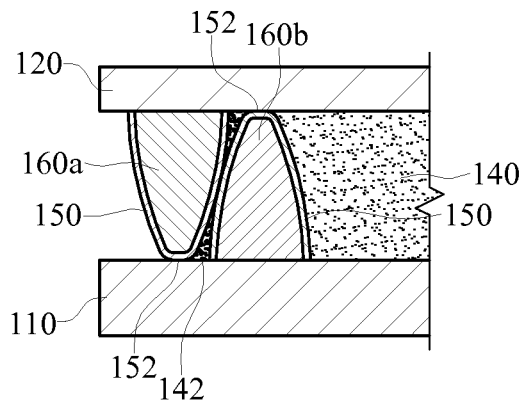
Figure 2L:
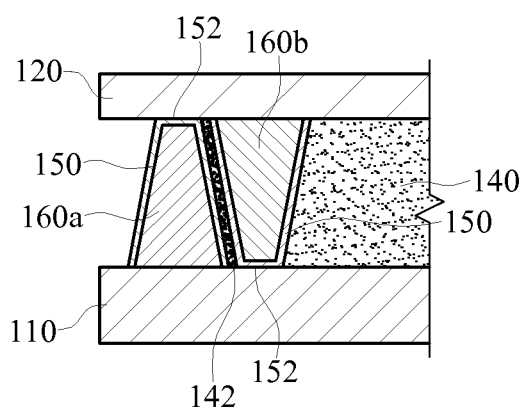
Figure 2M:
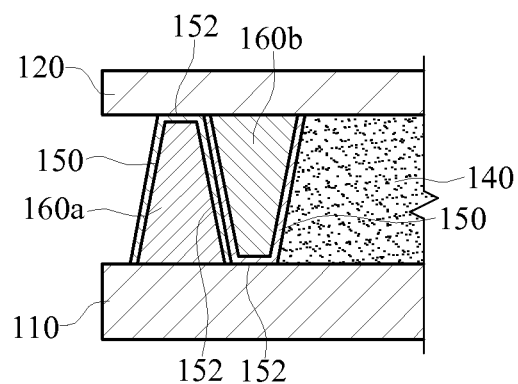
Figure 2N:
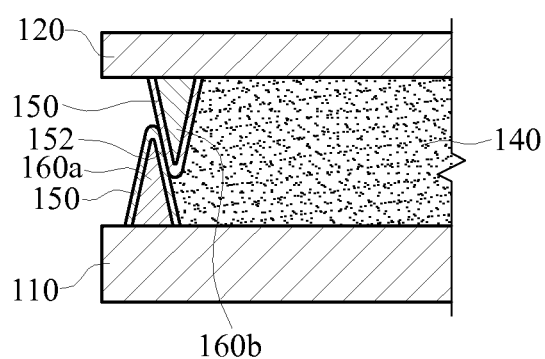

Referring to FIG. 2E to FIG. 2N illustrates a partial cross-sectional view in variant embodiments of the environmentally sensitive electronic device. A shape of the first sidewall barrier may be, for example but not limited to, rectangle, as shown in FIG. 2E to FIG. 2G, or trapezoid, as shown in FIG. 2H to FIG. 2J. Additionally, the environmentally sensitive electronic device may include one or more first sidewall barriers, e.g. the first sidewall barriers 160, 160a, 160b and 160c, the structure of these first sidewall barriers 160, 160a, 160b and 160c may be, for example but not limited to, concentric circles in the top view (as FIG. 1B) and disposed on the first substrate and between the first encapsulation area and the second encapsulation area, as shown in FIG. 2G, FIG. 2J and FIG. 2K to FIG. 2N. If there is a gap in between the two first sidewall barriers 160a and 160b, as shown in FIG. 2G and FIG. 2J to FIG. 2L, the gap can be filled with a filler 142. As an example and not by way of limitation, the filler 142 can be made of getter or resin. As an example and not by way of limitation, the getter can be a compound of calcium (Ca), calcium oxide (CaO), calcium-aluminum (CaAl2), barium-aluminum (BaAl4), nickel (Ni) and resin, a compound of BaAl4, Ni and resin, or a compound of Ca—Ba—Al and resin. As an example and not by way of limitation, the resin can be epoxy resin, silicide resin, silicon oxide compound resin. As another example and not by way of limitation, there is no gap between the first sidewall barriers 160a and 160b after the first sidewall barriers 160a and 160b are aimed and pressurized, as shown in FIG. 2M and FIG. 2N. Before pressurizing the first substrate 110 and the second substrate 120, the first packaging material and the second packaging material are respectively deposited on and doped into the surfaces of the two metalloid layers 150 respectively. As another example and not by way of limitation, the deposition and doping procedure can be performed as follows. The two metalloid layers 150 are etched by using ion beams, ions are deposited on and doped into the two metalloid layers 150 to form the first packaging material and the second packaging material. The first substrate 110 and the second substrate 120 are pressurized to bonding the first packaging material and the second packaging material together. Accordingly, the junction of the first packaging material and second packaging material between the two metalloid layers 150 will form the packaging body 152.

In the exemplary embodiment of FIG. 2A to FIG. 2N, the metalloid layer 150 is located on the first sidewall barrier 160. As another example and not by way of limitation, the metalloid layer 150 may also be located on at least one of the first substrate 110 and the second substrate 120.

In view of the above embodiments, if the packaging body 152 completely surrounds the entire environmentally sensitive electronic device 130, the packaging body 152 can be prevented from moisture or oxygen even through the filler 140 is not formed between the first substrate 110 and the second substrate 120 in the package.

Figure 3A:
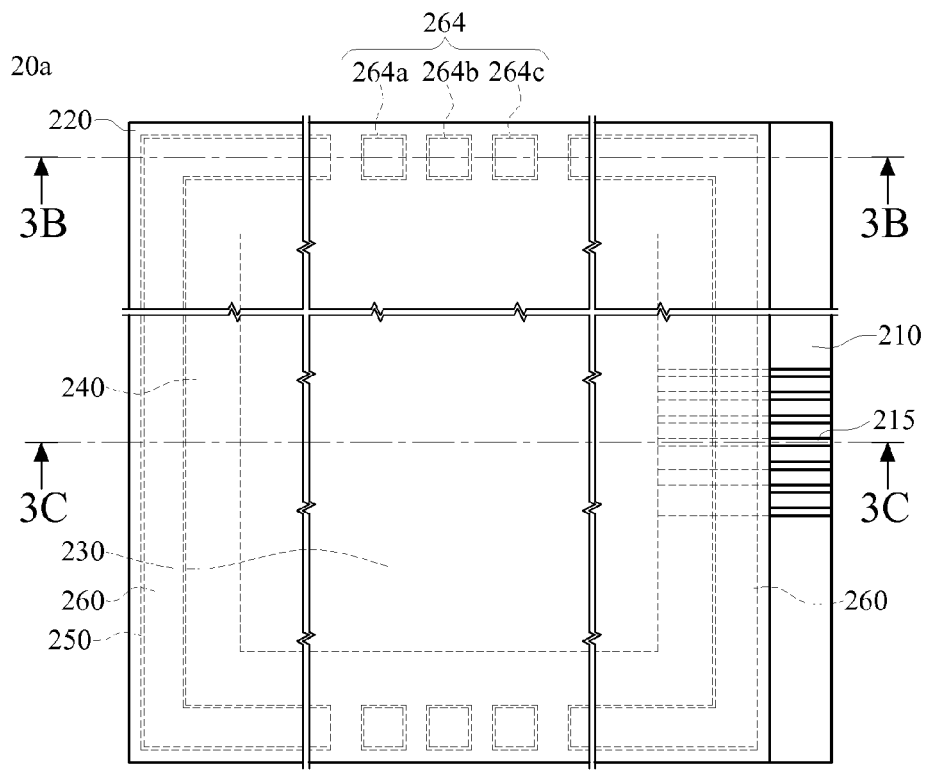
FIG. 3A illustrates a schematic top view of a package in accordance with the fourth embodiment in this disclosure.
Figure 3B:
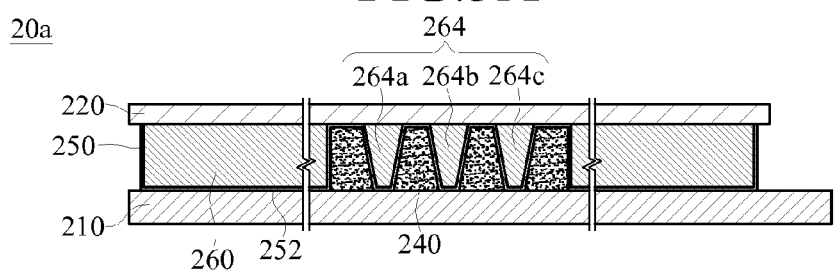
FIG. 3B and FIG. 3C illustrate two schematic cross-sectional views of a package in accordance with a fourth embodiment in this disclosure.
Figure 3C:
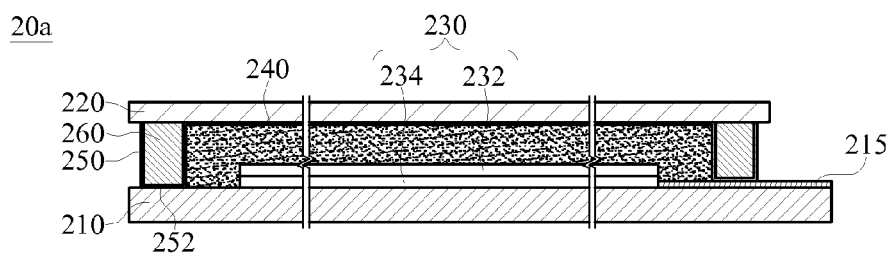

In a fourth embodiment, referring to FIG. 3A to FIG. 3E, FIG. 3A illustrate a top view of a package in accordance with the fourth embodiment of this disclosure, and FIG. 3B and FIG. 3C are two different cross-sectional views in accordance with FIG. 3A. The package 20a may comprise a first substrate 210, a plurality of trace wires 215, a second substrate 220, an environmentally sensitive electronic device 230, a filler 240, a metalloid layer 250, a packaging body 252, a plurality of first sidewall barriers 260, and a plurality of second sidewall barriers 264. The plurality of first sidewall barriers 260 and the plurality of second sidewall barriers 264 may be disposed on the second encapsulation area of the second substrate 220. Each of the first sidewall barriers 260 may be a barrier wall, and each of the second sidewall barriers 264 may be a barrier pillar. As shown in FIG. 3A, the first sidewall barriers 260 and the second sidewall barriers 264 cooperate to surround the environmentally sensitive electronic device 230 and the filler 240. The metalloid layer 250 can be formed on the surface of the first sidewall barriers 260 and the surface of the second sidewall barriers 264. The second packaging material is deposited on and doped into the surface of the metalloid layer 250 in the second encapsulation area of the second substrate 220, and a first packaging material is deposited on and doped into the metalloid layer 250 in the first encapsulation area on the first substrate 210. Thus, the junction (i.e. the contact region) between the metalloid layer 250 and the first substrate 210 will form the packaging body 252. In the present embodiment, the shape of each second sidewall barrier 264 can be like a trapezoid, a bell or a pillar. The gaps between the second sidewall barriers 264 and the first sidewall barriers 260 can be filled with the filler 240. As an example and not by way of limitation, the filler 240 can be made of elastomer such as acrylic resin or epoxy resin. As an example and not by way of limitation, the filler 240 can be glue films, or be liquid glue before being solidified.

Figure 3D:
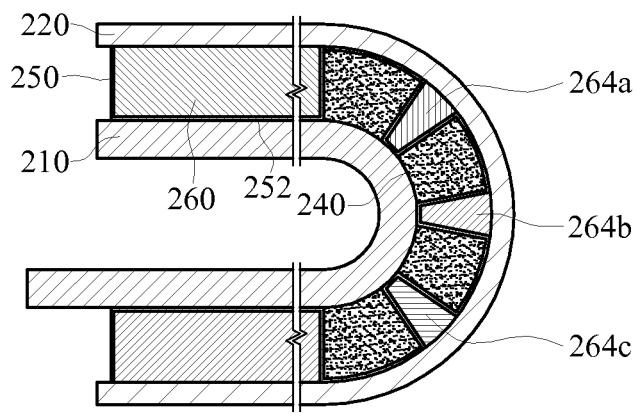
FIG. 3D to FIG. 3E illustrate schematic top views of the package in two bending states in accordance with the fourth embodiment in this disclosure.
Figure 3E:
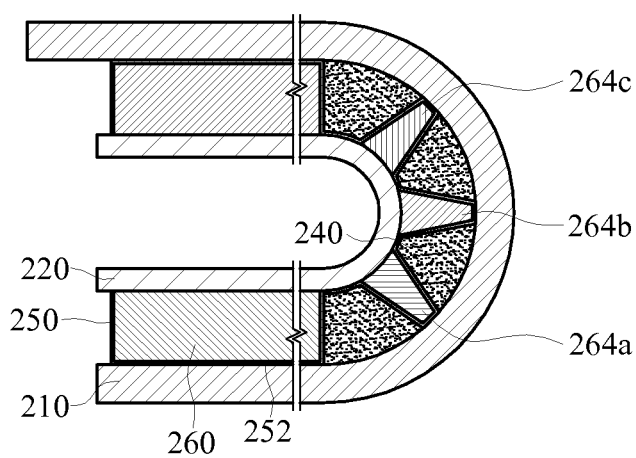

As an example and not by way of limitation, the package 20a can be flexible. In FIG. 3D and FIG. 3E, the portion, where the packaging body 252 is, is not curved, and the portions, where the second sidewall barriers 264, i.e. the second sidewall barriers 264a to 264c, and the filler 240 are, are curved. The second sidewall barrier 264 is formed on the second substrate 220. Because the filler 240 is made of elastomer, the filler 240 can bear the extruding on the second sidewall barrier 264 when the package 20a is curved.

Figure 3F:
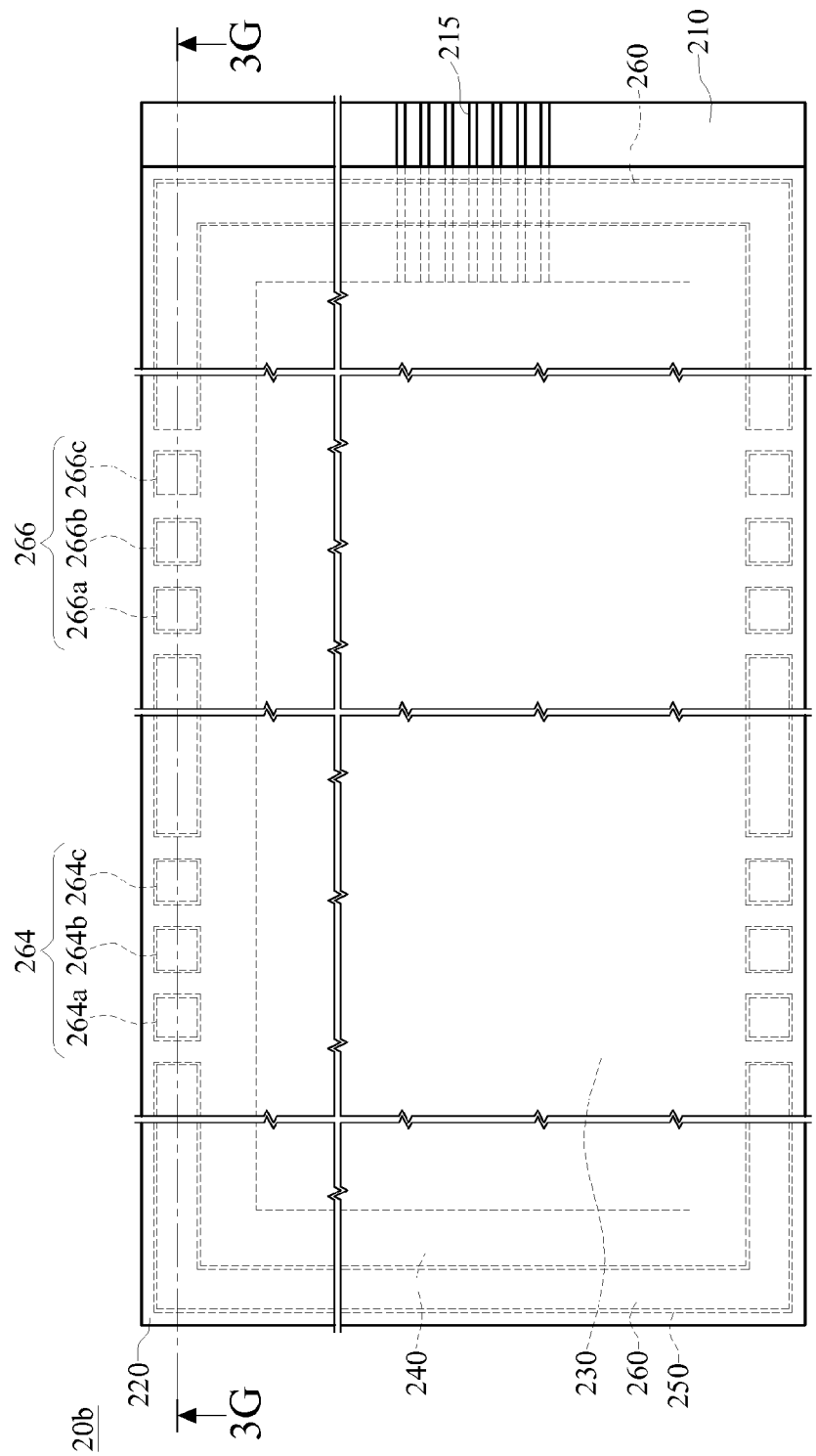
FIG. 3F to FIG. 3K illustrate two variants in accordance with the fourth embodiment in this disclosure.
Figure 3G:
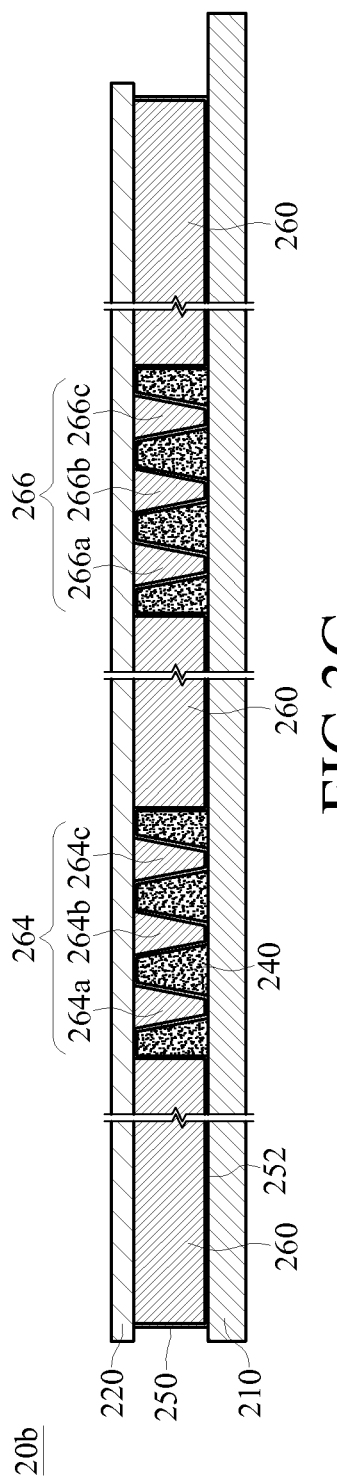
Figure 3H:
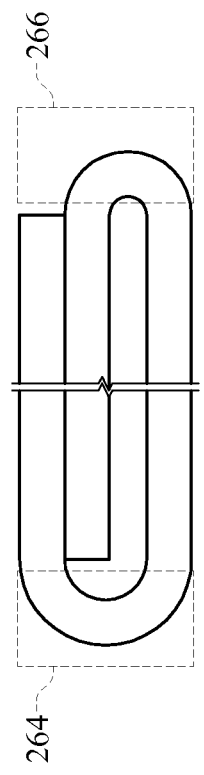

Referring to FIG. 3F, FIG. 3G, and FIG. 3H, FIG. 3F illustrates a top view of the package in FIG. 3A, and FIG. 3G illustrate a cross-sectional view in accordance with FIG. 3F. Compared with FIG. 3A, the package 20b in FIG. 3F may further comprise a plurality of second sidewall barriers 266. The shape of each second sidewall barrier 266 can be like a trapezoid, a bell, a pillar or any suitable shape, where the second SWB 266 can cooperate with the filler 240 to bear the extruding. The package 20b can be curved as shown in FIG. 3H in present embodiment.

Figure 3I:
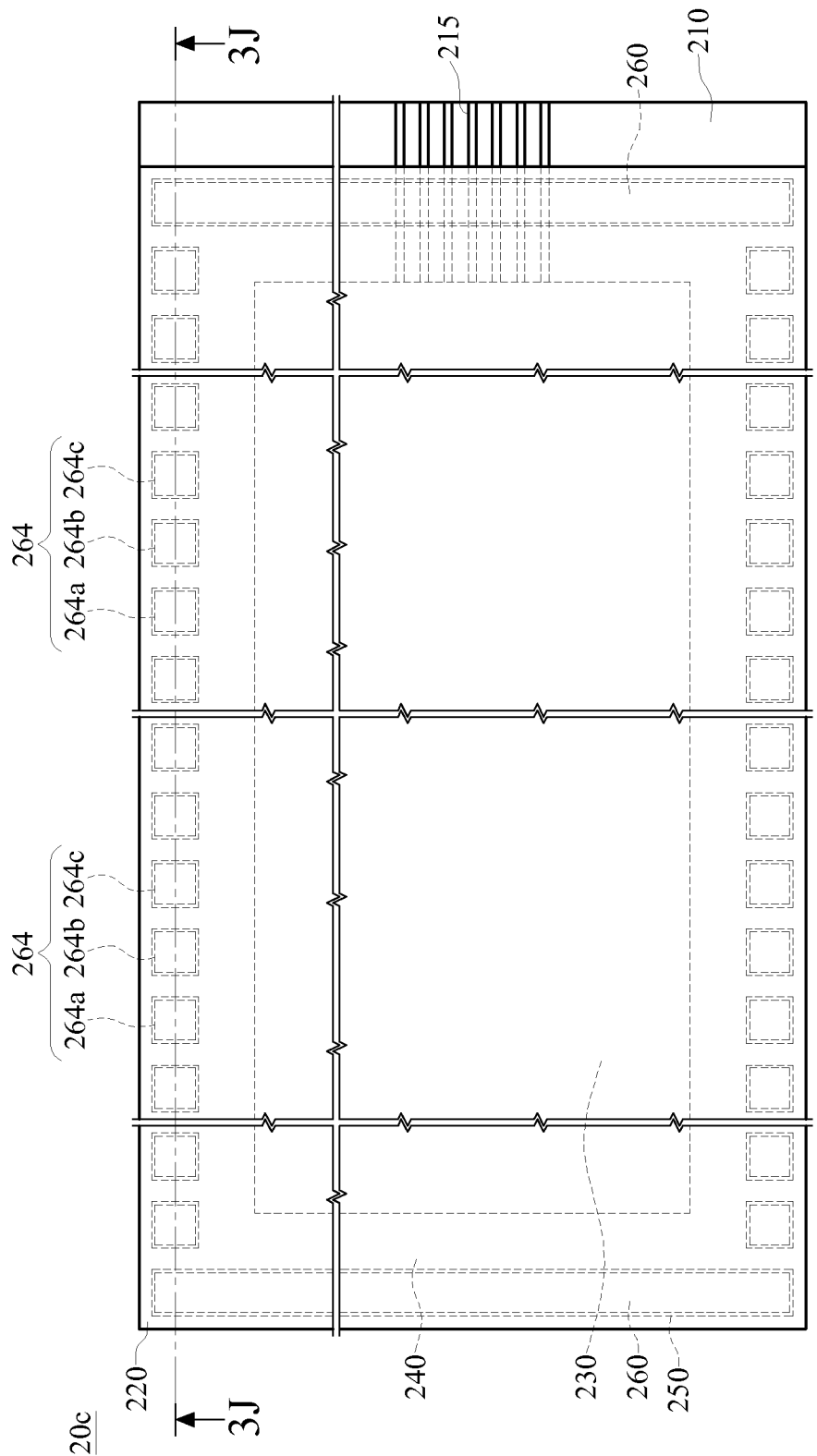
Figure 3J:
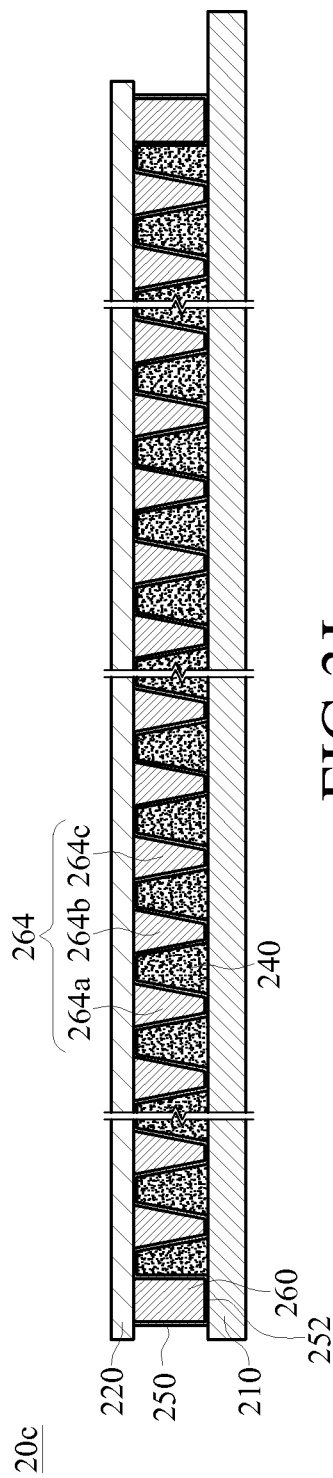
Figure 3K:
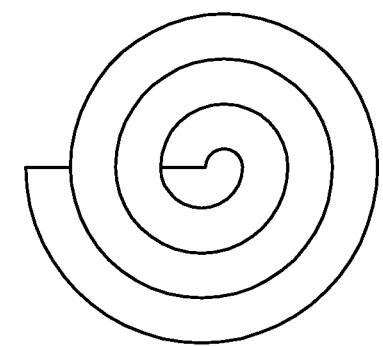

Referring to FIG. 3I, FIG. 3J, and FIG. 3K, FIG. 3I illustrates a top view of the package in FIG. 3A, and FIG. 3J illustrate a cross-sectional view in accordance with FIG. 3I. Compared with FIG. 3A, the package 20c in FIG. 3I may comprise two first sidewall barriers 260 located in a first edge (e.g. the left side) and a second edge (e.g. the right side) and a plurality of second sidewall barriers 264 located in a third edge and a fourth edge. In present embodiment, the package 20c may be folded as shown in FIG. 3K.

Although, in FIG. 3A to FIG. 3J, the metalloid layer 250 is disposed on the first sidewall barrier 260 and the second sidewall barrier 264, the metalloid layer 250 may be selectively disposed on the first substrate 210 or the second substrate 220, or on both of the first substrate 210 and the second substrate 220.

Figure 4A:
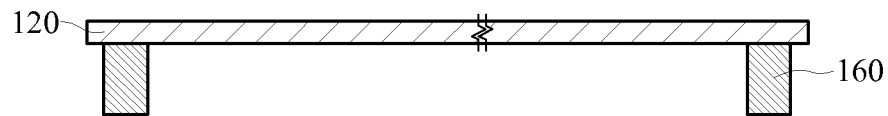
FIG. 4A to FIG. 4N illustrate a method to manufacture packages having environmentally sensitive electronic devices in accordance with one embodiment of the present disclosure.

The following are various exemplary embodiments illustrating a manufacturing method of a package of an environmentally sensitive electronic device. The package 10b shown in FIG. 2A having an environmentally sensitive electronic device is described as an example. FIG. 4A to FIG. 4N complement the description of the manufacturing method in more detail.

Figure 4B:
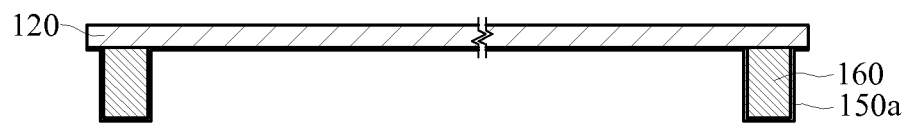
Figure 4C:
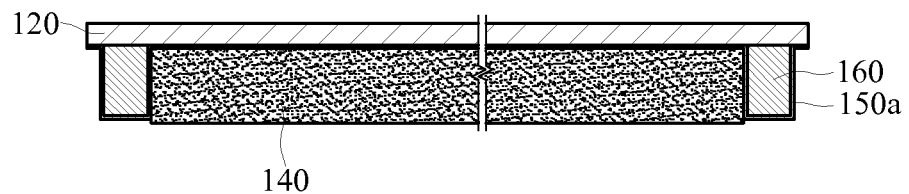

FIG. 4A to FIG. 4C are schematic cross-sectional views illustrating a method to manufacture packages having environmentally sensitive electronic devices in accordance with one embodiment of the present disclosure. Referring to FIG. 4A, in the present embodiment of the method to manufacture packages having environmentally sensitive electronic devices, a first sidewall barrier 160 may be formed in a second encapsulation area on a second substrate 120. The second substrate 120 is a flexible substrate or a rigid substrate, for instance.

As shown in FIG. 4B, a first metalloid layer 150a may be disposed on the second substrate 120. The first metalloid layer 150a covers the first sidewall barrier 160. A method for disposing the first metalloid layer 150a is, for example but not limited to, the chemical vapor deposition (CVD), atomic layer deposition (ALD) or sputtering. A packaging material for the metalloid layer 150a is, for example but not limited to, silicon nitride (SiNx), silicon oxide (SiOx), silicon oxide nitride (SiOxNy) or any other equivalent. The metalloid layer 150a may be formed by a monolayer or multiple players (i.e. one or more films). A thickness of the metalloid layer 150a is, for example but not limited to, 0.01 um to 100 um, and can isolate the environmentally sensitive electronic device from moisture and oxygen. In an alternative embodiment, more than one metalloid layer may be disposed on the second substrate 120. The metalloid layers may be made by different packaging materials. In FIG. 4C, the filler 140 can be formed on the second substrate 120 and is surrounded by the first sidewall barrier 160, or can be ignored. Hence, in some embodiments because no filler 140, the process of FIG. 4C is not necessary.

Figure 4D:
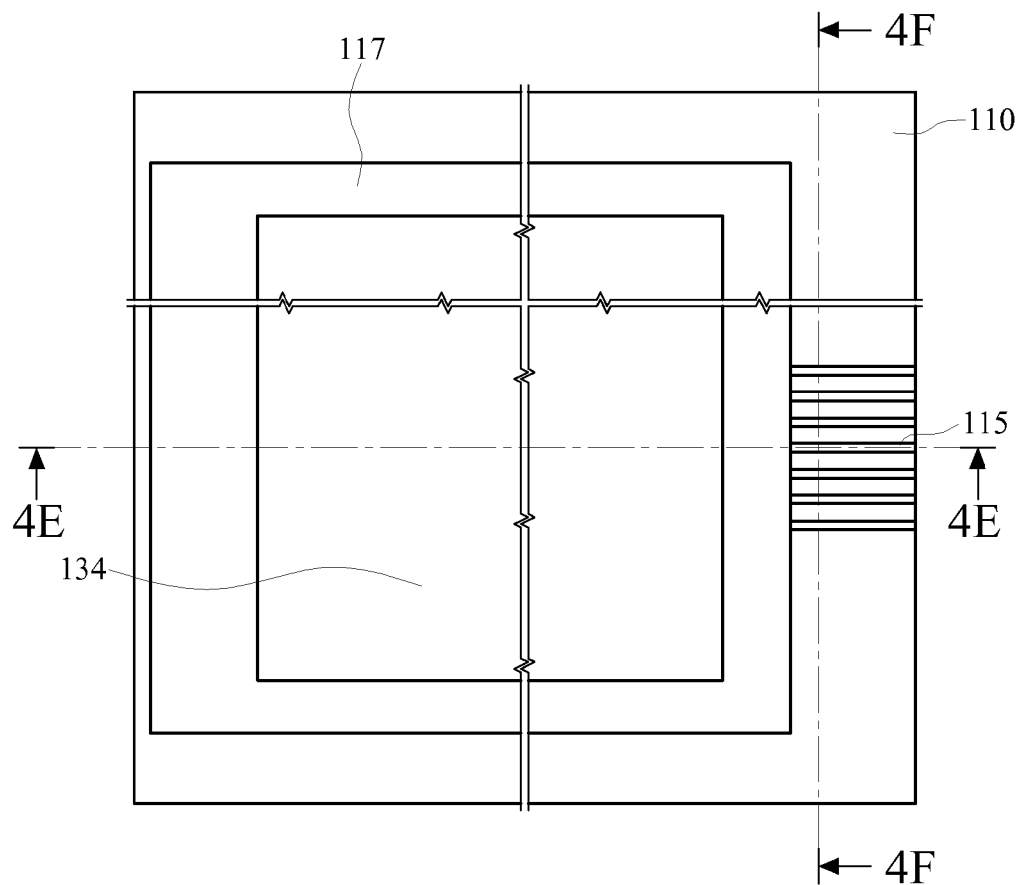
Figure 4E:
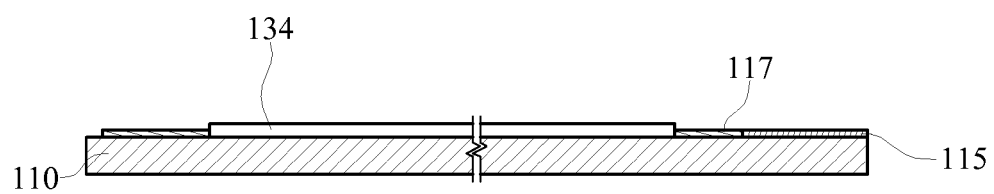
Figure 4F:
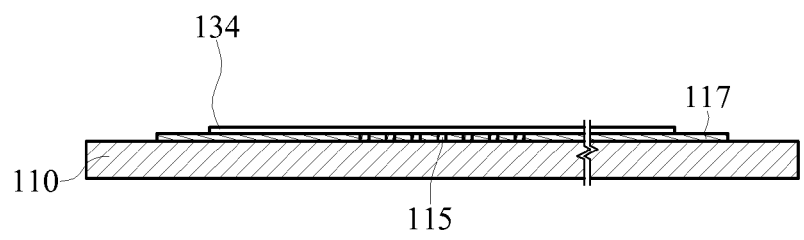

Referring to FIG. 4D to FIG. 4F, FIG. 4D illustrates a schematic top view of a first substrate in an exemplary embodiment. A plurality of trace wires 115 are disposed on the first substrate 110. A plurality of circuitries 117 and an active device 134 (or a passive device) are formed on the first substrate 110. As shown in FIG. 4E and FIG. 4F, it is noted that there is a rough portion on the surface of the first substrate 110 because of the plurality of trace wires 115 and the plurality of circuitries 117.

Figure 4G:
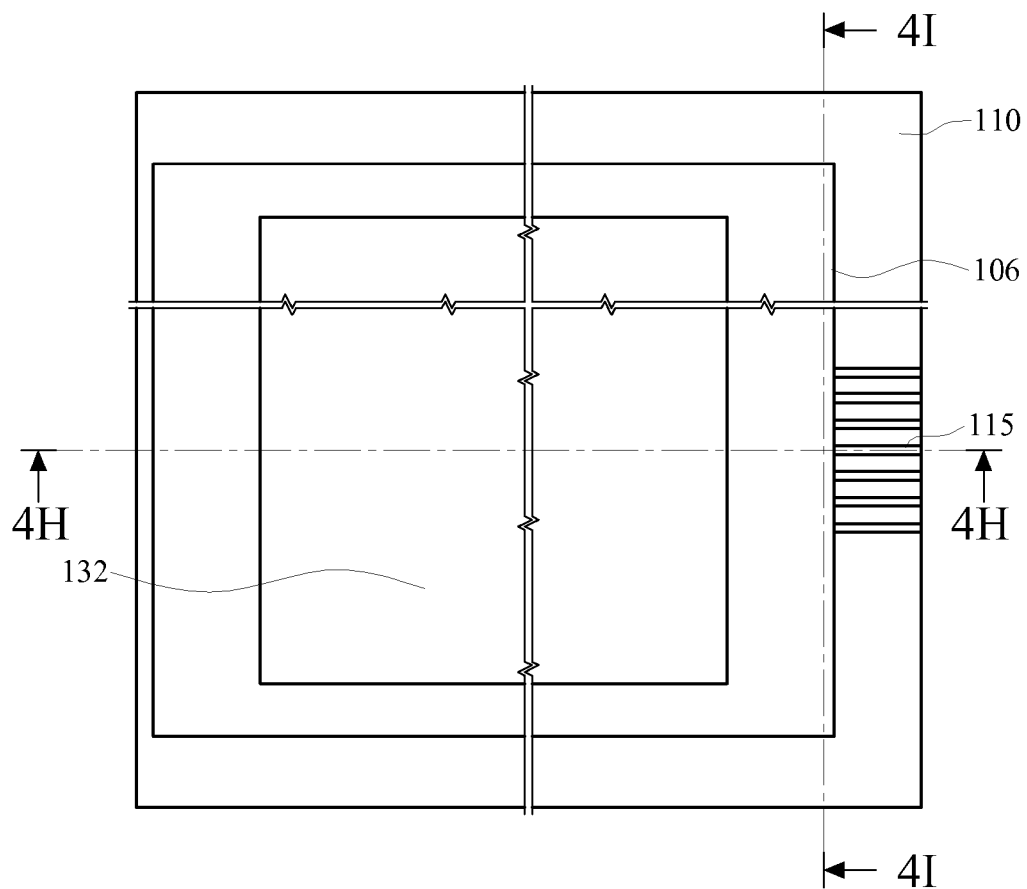
Figure 4H:
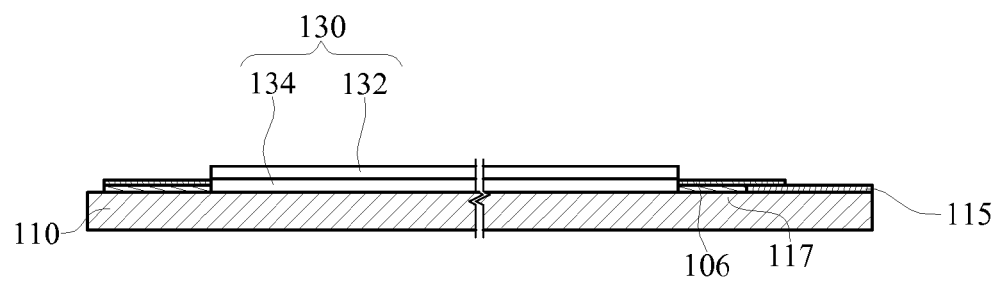
Figure 4I:
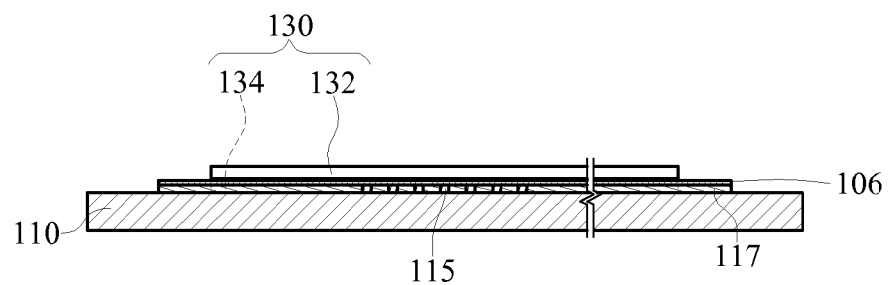
Figure 4N:
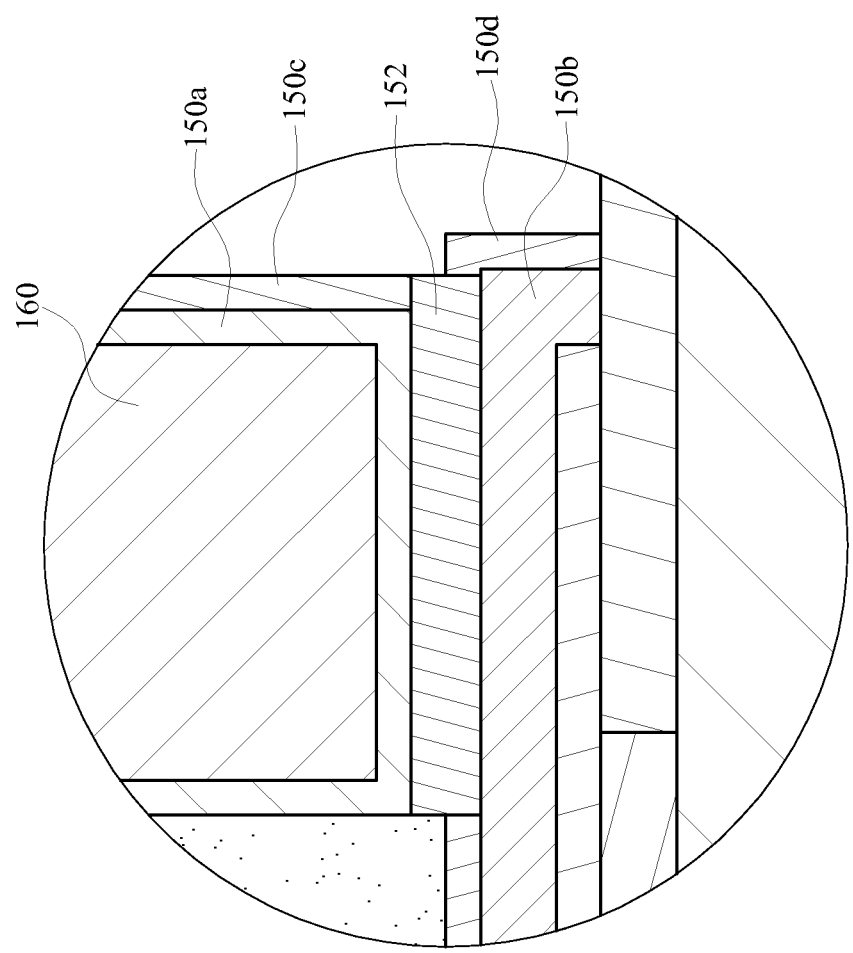

As shown in FIG. 4G to FIG. 4I, FIG. 4G illustrates a schematic top view of the first substrate in the method to manufacture an environmentally sensitive electronic device in accordance with one embodiment of the present disclosure. Referring to FIG. 4F, because the trace wires 115 and the circuitries 117 are formed on the first substrate 110, the surface of the first substrate 110 will have a rough portion. A planarization process is performed to form a planarization layer 106 so that the rough portion is flattened, as shown in FIG. 4H and FIG. 4I. As an example and not by way of limitation, the planarization layer 106 can be made of macromolecular packaging material such as photo-sensitive polyimide photoresist, photo-sensitive acrylic photoresist, photo-sensitive photoresist with silicon. As an example and not by way of limitation, the method of flattening the rough portion can use yellow light, a photolithography procedure and an etching procedure. As an example and not by way of limitation, the planarization layer 106 has an average surface roughness which is substantially less than 50 nanometers or even less than 10 nanometers. Similarly, the second metalloid layer 150b can be flattened.

FIG. 4J illustrates a schematic cross-sectional view of the first substrate in the method of manufacturing an environmentally sensitive electronic device in accordance with one embodiment of the present disclosure. A display medium 132 is form on the active device 134 to form an environmentally sensitive electronic device 130. A second metalloid layer 150b is disposed on the first substrate 110. Although, in FIG. 4J, the second metalloid layer 150b covers the environmentally sensitive electronic device 130 and the planarization layer 106, the second metalloid layer 150b may partially or completely cover the environmentally sensitive electronic device 130. A thickness of the second metalloid layer 150b is, for example but not limited to, 0.01 um to 100 um. In an alternative embodiment, more than one metalloid layer may be disposed on the first substrate 110. As an example and not by way of limitation, the metalloid layers may be formed by one or more layers, and be made of different packaging materials.

Although, in the aforementioned method, the processes related to the second substrate 120 are prior to the processes related to the first substrate 110, in another embodiment, the processes related to the first substrate 110 are prior to or simultaneous with the processes related to the second substrate 120.

As shown in FIG. 4K, the second substrate 120 is placed above the first substrate 110. A thickness of the filler 140 is appropriately chosen to form a gap between the first metalloid layer 150a and the second metalloid layer 150b for further process.

As shown in FIG. 4L, at least one ion-beam source 190 is used to dope metalloid ion onto the first metalloid layer 150a and the second metalloid layer 150b so as to form the first packaging material 150c and the second packaging material 150d on the first metalloid layer 150a and the second metalloid layer 150b, respectively. In the production method, for example, metalloid and transition-metal ions are deposited on and doped into the first metalloid layer 150a and the second metalloid layer 150b by using at least one ion beam source 190 and at least one metalloid source 191 in FIG. 4L. As an example and not by way of limitation, the deposition and doping procedure is performed as follows. First, the surface treatment is performed on the first metalloid layer 150a and the second metalloid layer 150b by using the one or more ion beam sources. Then, ions are deposited on and doped into the first metalloid layer 150a and the second metalloid layer 150b by using the one or more metalloid sources 191 and ion beam sources 190, so as to respectively form the first packaging material 150c on part of the first metalloid layer 150a and form the second packaging material 150d on part of the second metalloid layer 150b. Thus, the partial surface of the first metalloid layer 150a and the partial surface of the second metalloid 150b will be activated. The first packaging material 150c and the second packaging material 150d can include one or more metalloid elements, e.g. silicon, and one or more transition-metal elements, e.g. at least one of iron and chromium.

As shown in FIG. 4M, the first substrate 110 and the second substrate 120 are placed in a vacuum environment and experienced an appropriate pressure P for an adequate duration of time so that the bonding of metalloid and transition-metal (i.e. the bonding layer) is formed or occurs between the metalloid layer 150a, the second metalloid layer 150b, the first packaging material 150c, and the second packaging material 150d. The bonding of metalloid and transition-metal forms the packaging body. As an example and not by way of limitation, the bonding of metalloid and transition-metal may be Si—Fe bonding. The air pressure in the vacuum environment is, for example but not limited to, $10^{-4}$ Pa. The pressure P is, for example but not limited to, 840 NT/inch$^2$. The duration of time is, for example but not limited to, 100 seconds to 200 seconds (or 60 to 300 seconds). In one exemplary embodiment, the pressure P (i.e. a contact pressure) is 5000 NT/6 inch, and the duration of time is 120 seconds to 180 seconds. The air pressure, the pressure P, the duration of time, and the relation among these factors can be derived from experiment according to this disclosure.

As above mentioned, the first packaging material 150c and the second packaging material 150d can be respectively deposited on and doped into the first metalloid layer 150a and the second metalloid layer 150b by using metalloid and transition-metal, the first packaging material 150c on the first metalloid layer 150a and the second packaging material 150d on the second metalloid layer 150b will be bonded together to form a bonding layer after being pressurized. Thus, the packaging body 152 includes at least part of the first packaging material 150c and at least part of the bonding layer of the second packaging material 150d. In other words, the packaging body 152 in FIG. 4N formed by bonding the first packaging material 150c and the second packaging material 150d, which include transition-metal and metalloid, together and surrounds the environmentally sensitive electronic device 130. As an example and not by way of limitation, the thickness of the packaging body 152 can be in a range of 1 to 1000 nanometers (nm) or 10 to 200 nanometers (nm).

As shown in FIG. 4N, the packaging body 152 is formed by transforming the metalloid layer 150 into a bonding of metalloid and transition-metal. Hence, the package is sealed by the packaging body 152, which comprises a bonding layer with metalloid and transition-metal.

Figure 5:
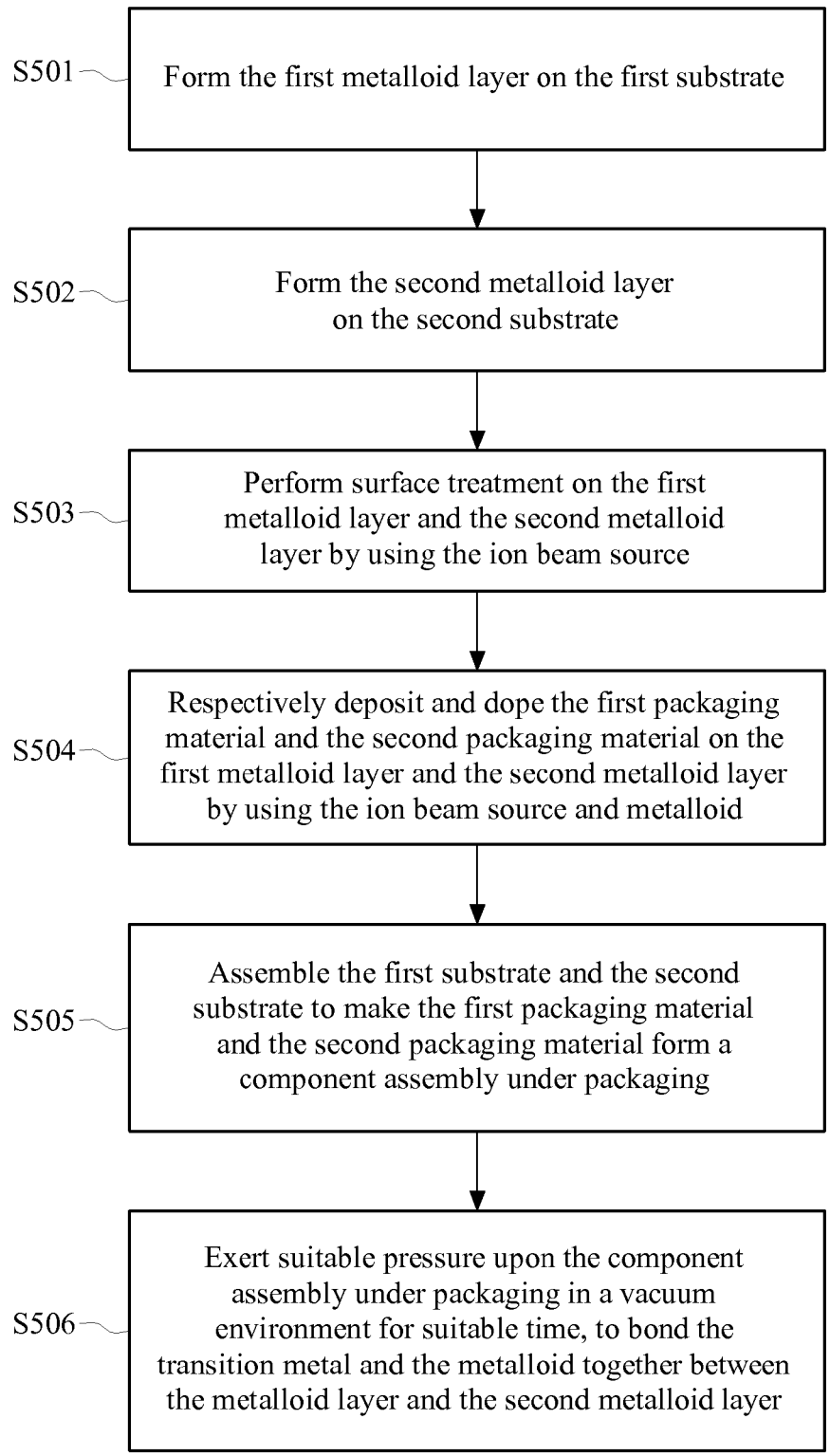
FIG. 5 illustrates a flow chart of the method in accordance with this disclosure.

The fabrication method of the package of an environmentally sensitive electronic device can be summarized in a flowchart in FIG. 5. The fabrication method may include the following steps in accordance with this disclosure. The fabrication method may comprise:

As shown in S501, a first metalloid layer is disposed on a first substrate;

As shown in S502, a second metalloid layer is disposed on a second substrate;

As shown in S503, a surface treatment is performed on the first metalloid layer and the second metalloid layer by using an ion beam source;

As shown in S504, a first packaging material and the second packaging material are respectively deposited on and doped into the first metalloid layer and the second metalloid layer by using an ion beam source and a metalloid source;

As shown in S505, the first substrate and the second substrate are assembled or arranged to make the first packaging material and the second packaging material form a component assembly under packaging and As shown in S506, this component assembly under packaging will be exerted suitable pressure upon in a vacuum environment for suitable time, to bond the transition-metal and the metalloid together between the first metalloid layer and the second metalloid layer.

As set forth the above, in the package of an environmentally sensitive electronic device, the packaging body of the present disclosure may be formed between the first substrate and the second substrate while also surrounding the environmentally electronic sensitive device, may have a bonding of transition-metal and metalloid therein. Consequently, the package becomes well sealed without gap in the edge. As a result, the lifespan of the environmentally sensitive electronic device and the lifespan of the package may be both enhanced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A package of an environmentally sensitive electronic device, comprising:
 a first substrate, at least part of peripheral edge of which is defined as a first encapsulation area in which there is a first packaging material;
 the environmentally sensitive electronic device which is formed on the first substrate and is surrounded by the first encapsulation area;
 a second substrate, at least part of peripheral edge of which is defined as a second encapsulation area around the environmentally sensitive electronic device, wherein a location of the second encapsulation area corresponds to a location of the first encapsulation area, and there is a second packaging material within the second encapsulation area; and
 a packaging body, formed between the first encapsulation area and the second encapsulation area, and comprising a bonding layer comprising at least part of the first packaging material and at least part of the second packaging material, wherein the first packaging material and the second packaging material are in direct contact.

2. The package according to claim 1, wherein the first packaging material and the second packaging material are made of at least one element selected from a group composed of silicon, iron, chromium, oxygen, nitrogen, carbon and hydrogen.

3. The package according to claim 1, wherein the first packaging material and the second packaging material are either metalloid or transition-metal.

4. The package according to claim 1, wherein a thickness of the packaging body is in a range of 1 to 1000 nanometers.

5. The package according to claim 1, wherein the first packaging material is formed on a first metalloid layer formed on the first substrate, and the second packaging material is formed on a second metalloid layer formed on the second substrate.

6. The package according to claim 5, further comprising: a filler formed between the first substrate and the second substrate and surrounded by the packaging body.

7. The package according to claim 5, wherein the first metalloid layer and the second metalloid layer comprise at least one first metalloid film.

8. The package according to claim 7, wherein the first metalloid film is made of at least one element selected from a group composed of boron, boride, silicon, silicide, germanium, germanide, arsenic, arsenide, selenium, selenide, antimony, antimonide, polonium and polonide.

9. The package according to claim 7, wherein the first packaging material is deposited on and doped into part of the first metalloid layer, and the second packaging material is deposited on and doped into part of the second metalloid layer.

10. The package according to claim 5, wherein a thickness of the first metalloid layer and a thickness of the second metalloid layer are in a range of 0.01 to 100 micrometers.

11. A package of an environmentally sensitive electronic device, comprising:
 a first substrate, at least part of peripheral edge of which is defined as a first encapsulation area in which there is a first packaging material;
 the environmentally sensitive electronic device which is on the first substrate and is surrounded by the first encapsulation area;
 a second substrate, at least part of peripheral edge of which is defined as a second encapsulation area around the environmentally sensitive electronic device, wherein a location of the second encapsulation area corresponds to a location of the first encapsulation area, and there is a second packaging material within the second encapsulation area;
 a first sidewall barrier which is on the second substrate, is between the first encapsulation area and the second encapsulation area, and surrounds the environmentally sensitive electronic device; and
 a packaging body which is between the first sidewall barrier and the first substrate and comprises a bonding layer comprising at least part of the first packaging material and at least part of the second packaging material, wherein the first packaging material and the second packaging material are in direct contact.

12. The package according to claim 11, wherein the first packaging material and the second packaging material are made of at least one element selected from a group composed of silicon, iron, chromium, oxygen, nitrogen, carbon and hydrogen.

13. The package according to claim 11, wherein the first packaging material and the second packaging material are either metalloid or transition-metal.

14. The package according to claim 11, wherein a thickness of the packaging body is in a range of 1 to 1000 nanometers.

15. The package according to claim 11, wherein the first packaging material is formed on a first metalloid layer formed on the first substrate, and the second packaging material is formed on a second metalloid layer formed on the first sidewall barrier.

16. The package according to claim 15, further comprising: a filler which is between the first substrate and the second substrate and is surrounded by the first sidewall barrier.

17. The package according to claim 15, wherein the first metalloid layer and the second metalloid layer are formed by one or more first metalloid films.

18. The package according to claim 17, wherein the first metalloid film is made of at least one element selected from a group composed of boron, boride, silicon, silicide, germanium, germanide, arsenic, arsenide, selenium, selenide, antimony, antimonide, polonium and polonide.

19. The package according to claim 17, wherein the first packaging material is deposited on and doped into part of the first metalloid layer, and the second packaging material is deposited on and doped into part of the second metalloid layer.

20. The package according to claim 15, wherein a thickness of the first metalloid layer and a thickness of the second metalloid layer are in a range of 0.01 to 100 micrometers.

21. The package according to claim 11, wherein a top surface of the first sidewall barrier is planar, and the packaging body is between the top surface and the first substrate.

22. The package according to claim 11, further comprising: another first sidewall barrier which is on the first substrate and between the first encapsulation area and the second encapsulation area, wherein the first sidewall barriers concentrically surround the environmentally sensitive electronic device.

23. A package of an environmentally sensitive electronic device, comprising:
- a first substrate, at least part of peripheral edge of which is defined as a first encapsulation area in which there is a first packaging material;
- the environmentally sensitive electronic device which is on the first substrate and is surrounded by the first encapsulation area;
- a second substrate, at least part of peripheral edge of which is defined as a second encapsulation area and surrounds the environmentally sensitive electronic device, wherein a location of the second encapsulation area corresponds to a location of the first encapsulation area, and there is a second packaging material in the second encapsulation area;
- a first sidewall barrier which is on the first substrate and between the first encapsulation area and the second encapsulation area;
- a plurality of second sidewall barriers which are on the second substrate and between the first encapsulation area and the second encapsulation area and cooperate with the first sidewall barrier to surround the environmentally sensitive electronic device; and
- a packaging body which is between the first sidewall barrier and the first substrate and comprises a bonding layer comprising at least part of the first packaging material and at least part of the second packaging material, wherein the first packaging material and the second packaging material are in direct contact.

24. The package according to claim 23, wherein the first packaging material and the second packaging material are made of at least one element selected from a group composed of silicon, iron, chromium, oxygen, nitrogen, carbon and hydrogen.

25. The package according to claim 23, wherein the first packaging material and the second packaging material are either metalloid or transition-metal.

26. The package according to claim 23, wherein a thickness of the packaging body is in a range of 1 to 1000 nanometers.

27. The package according to claim 23, wherein the first packaging material is formed on a first metalloid layer formed on the first substrate, the second packaging material is formed on a second metalloid layer, and the second metalloid layer is formed on the first sidewall barrier and a second sidewall barrier.

28. The package according to claim 27, further comprising: a filler which is between the first substrate and the second substrate and is surrounded by the first sidewall barrier and the second sidewall barriers.

29. The package according to claim 27, wherein the first metalloid layer and the second metalloid layer are formed by one or more first metalloid films.

30. The package according to claim 29, wherein the first metalloid film is made of at least one element selected from a group composed of boron, boride, silicon, silicide, germanium, germanide, arsenic, arsenide, selenium, selenide, antimony, antimonide, polonium and polonide.

31. The package according to claim 29, wherein the first packaging material is deposited on and doped into part of the first metalloid layer, and the second packaging material is deposited on and doped into part of the second metalloid layer.

32. The package according to claim 27, wherein a thickness of the first metalloid layer and a thickness of the second metalloid layer are in a range of 0.01 to 100 micrometers.

33. The package according to claim 23, wherein a top surface of the first sidewall barrier is planar, and the packaging body is between the top surface and the first substrate.

34. The package according to claim 23, wherein the second sidewall barriers are at a first side of the second encapsulation area and at a second side facing to the first side, and the first substrate and the second substrate are flexible.

* * * * *